(12) United States Patent
Ko et al.

(10) Patent No.: US 7,920,004 B2
(45) Date of Patent: Apr. 5, 2011

(54) APPARATUS AND METHOD FOR DUTY CYCLE CORRECTION

(75) Inventors: Jin-Ho Ko, Daejeon (KR); Sang-Hyun Cho, Daejeon (KR); Hyung-Chul Park, Daejeon (KR); Dae-Sik Park, Seoul (KR)

(73) Assignee: Phychips, Inc. (KR)

( * ) Notice: Subject to any disclaimer, the term of this patent is extended or adjusted under 35 U.S.C. 154(b) by 0 days.

(21) Appl. No.: 12/560,943

(22) Filed: Sep. 16, 2009

(65) Prior Publication Data

US 2010/0109731 A1    May 6, 2010

(30) Foreign Application Priority Data

Nov. 4, 2008    (KR) .................. 10-2008-0108997

(51) Int. Cl.
*H03K 3/017* (2006.01)
(52) U.S. Cl. ........................................... 327/175
(58) Field of Classification Search ........... 327/172–175
See application file for complete search history.

(56) References Cited

U.S. PATENT DOCUMENTS

| | | | | |
|---|---|---|---|---|
| 6,181,178 B1 * | 1/2001 | Choi | ........................... | 327/175 |
| 6,847,244 B2 * | 1/2005 | Pillay et al. | ................... | 327/174 |
| 6,853,227 B2 * | 2/2005 | Laletin | ........................ | 327/175 |
| 7,463,075 B2 * | 12/2008 | White | ........................... | 327/175 |
| 7,755,406 B2 * | 7/2010 | Huang et al. | ................... | 327/175 |

* cited by examiner

*Primary Examiner* — Hai L Nguyen
(74) *Attorney, Agent, or Firm* — The Belles Group, P.C.

(57) ABSTRACT

There is provided an apparatus for duty cycle correction. The apparatus for duty cycle correction comprises a moving sum unit performing a moving sum calculation with respect to the square-wave signal and outputting the moving sum signal subjected to moving sum calculation, a comparison unit comparing the moving sum signal with a predetermined threshold voltage, outputting a high signal or low signal, a mean value calculation unit calculating the mean value of an output signal outputted from the comparison unit, the output signal being included in a section having a period integer times greater than that of the square-wave signal, and a threshold voltage control unit comparing the mean value with a middle value, increasing the threshold voltage when the mean value is greater than the middle value, and decreasing the threshold voltage when the mean value is less than the middle value.

2 Claims, 13 Drawing Sheets

APPARATUS AND METHOD FOR DUTY CYCLE CORRECTION

CROSS-REFERENCE TO RELATED APPLICATION

This application claims priority from Korean Patent Application No. 10-2008-0108997, filed Nov. 4, 2008, which is hereby incorporated by reference.

BACKGROUND OF INVENTION

1. Technical Field

The present invention relates to an apparatus and method for duty cycle correction.

2. Discussion of the Related Art

A duty cycle is a ratio between time when a signal is transmitted and time when the signal is not transmitted during one period in a wire/wireless communication or circuit system. A clock signal having a duty cycle of 50% is required in a general system. That is, the duty cycle of a clock signal is necessarily constant so as to ensure a normal operation of the system. The signal having a duty cycle that is not 50% refers to a signal in which the ratio occupied by a high or low section from the entire clock signal is greater or less than 0.5.

An apparatus for duty cycle correction is required to allow the duty cycle of a clock signal to be maintained constant. To this end, a conventional apparatus for duty cycle correction corrects a distorted duty cycle of a signal using the signal having the distorted duty cycle and an external signal. However, the conventional apparatus for duty cycle correction is necessarily provided with a complicated control circuit that receives a signal inputted from the outside thereof and calculates the delay time of a distorted signal. Therefore, the control circuit is complicated, and current consumption is also increased.

SUMMARY OF THE INVENTION

The present invention is conceived to solve the aforementioned problems. Accordingly, the present invention provides an apparatus and method for duty cycle correction, which corrects an input signal having a distorted duty cycle into a signal having a duty cycle of 50% using a simple method.

According to an aspect of the present invention, there is provided an apparatus for duty cycle correction which corrects the duty cycle of a square-wave signal having a distorted duty cycle, wherein: the square-wave signal is a signal having samples with a shorter period than that of the square-wave signal, and the apparatus comprises: a moving sum unit performing a moving sum calculation with respect to the square-wave signal and outputting the moving sum signal subjected to moving sum calculation, a comparison unit comparing the moving sum signal with a predetermined threshold voltage, outputting a high signal when the moving sum signal is higher than the threshold voltage, and outputting a low signal when the moving sum signal is lower than the threshold voltage, a mean value calculation unit calculating the mean value of an output signal outputted from the comparison unit, the output signal being included in a section having a period integer times greater than that of the square-wave signal, and a threshold voltage control unit comparing the mean value calculated by the mean value calculation unit with a middle value between the high and low signals, increasing the threshold voltage when the mean value is greater than the middle value, and decreasing the threshold voltage when the mean value is less than the middle value.

The moving sum unit calculates the sum of samples contained in a sliding window and outputting the calculated sum as the moving sum signal, the sliding window is slid by the period of the sample, whenever the sliding window is slid by the period of the sample, the moving sum unit calculates the sum of samples contained in the sliding window and outputting the calculated sum as the moving sum signal, and the sliding window is a time section integer greater than the period of the sample.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Hereinafter, an apparatus for duty cycle correction according to an exemplary embodiment of the present invention will be described in detail with reference to the accompanying drawings.

Figure 1:
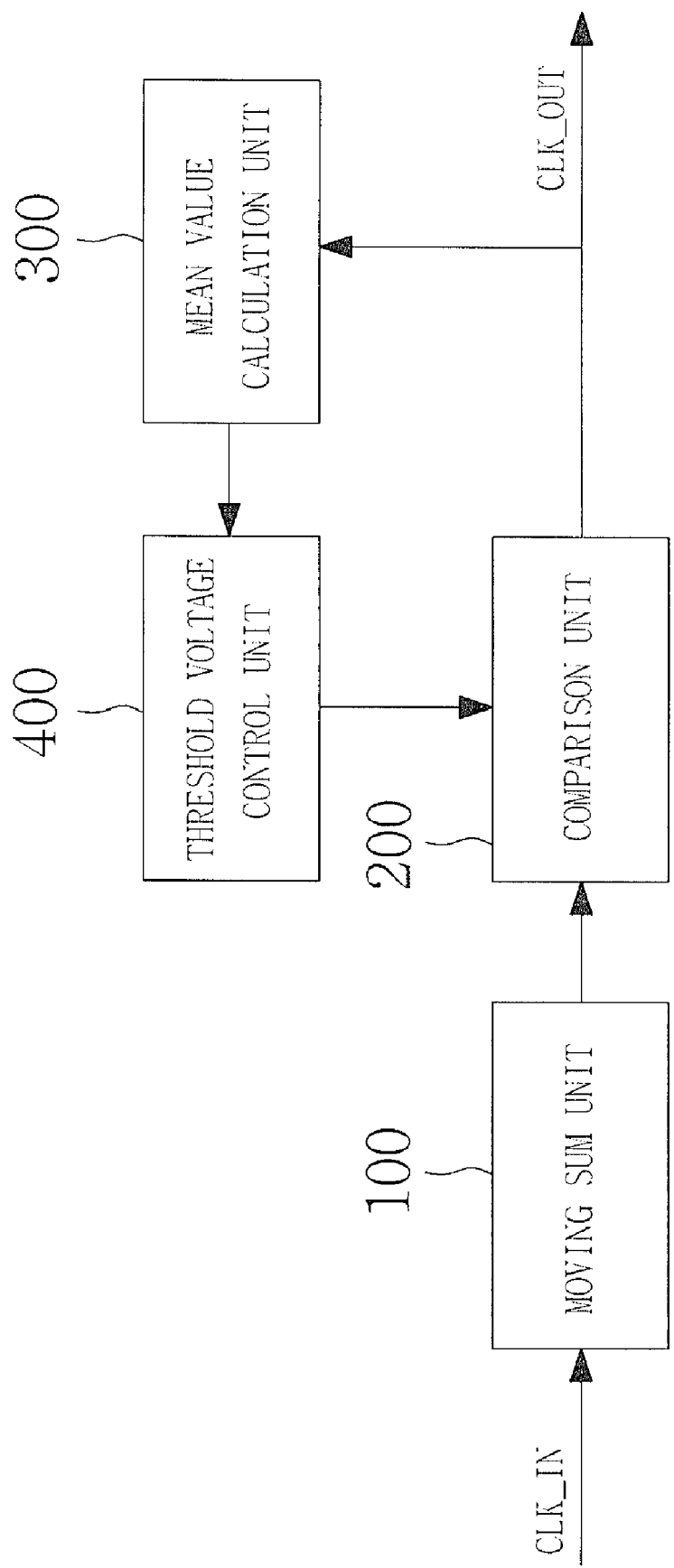
FIG. 1 is a block diagram schematically illustrating the configuration of an apparatus for duty cycle correction according to an embodiment of the present invention.

FIG. 1 is a block diagram schematically illustrating the configuration of an apparatus for duty cycle correction according to an embodiment of the present invention.

The moving sum unit 100 receives a square-wave signal CLK_IN having a uniform period and outputs a moving sum signal obtained by performing a moving sum calculation with respect to the square-wave signal CLK_IN. Here, the square-wave signal CLK_IN has samples with a shorter period than that of the square-wave signal CLK_IN.

The moving sum signal obtained by performing a moving sum calculation with respect to a signal having a set of samples is defined by a signal. In the signal, a virtual sliding window having a length integer times greater than that of a sample period is framed and then slid by the period of the sample. Whenever the sliding window is slid, the sum of samples contained in the sliding window is calculated. Then, the calculated sums are arranged by the period of the sample. The concept of the moving sum calculation will be more readily understood from the following detailed example.

Figure 2:
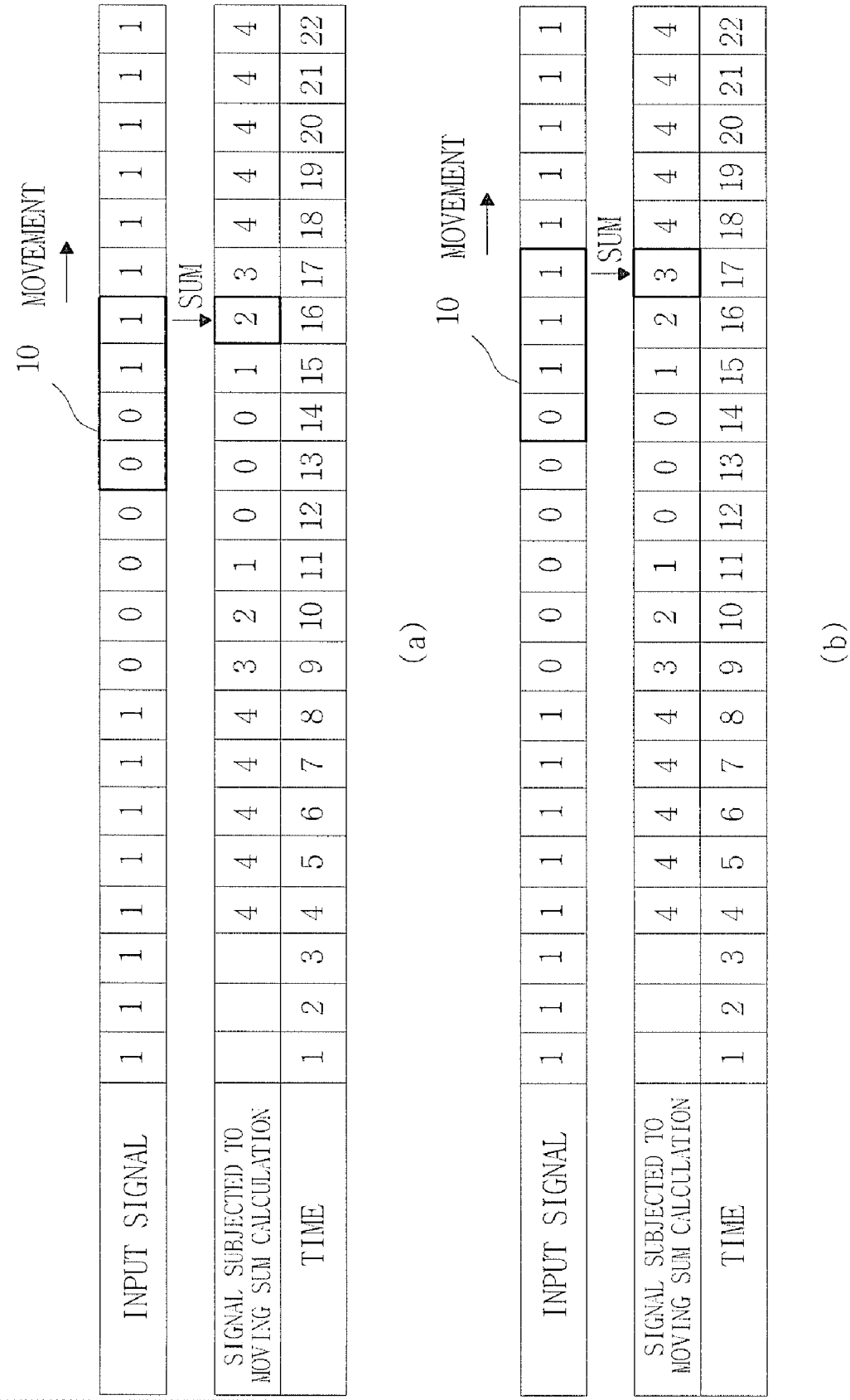
FIGS. 2 and 3 are views illustrating an example of the concept of a moving sum calculation
Figure 3:
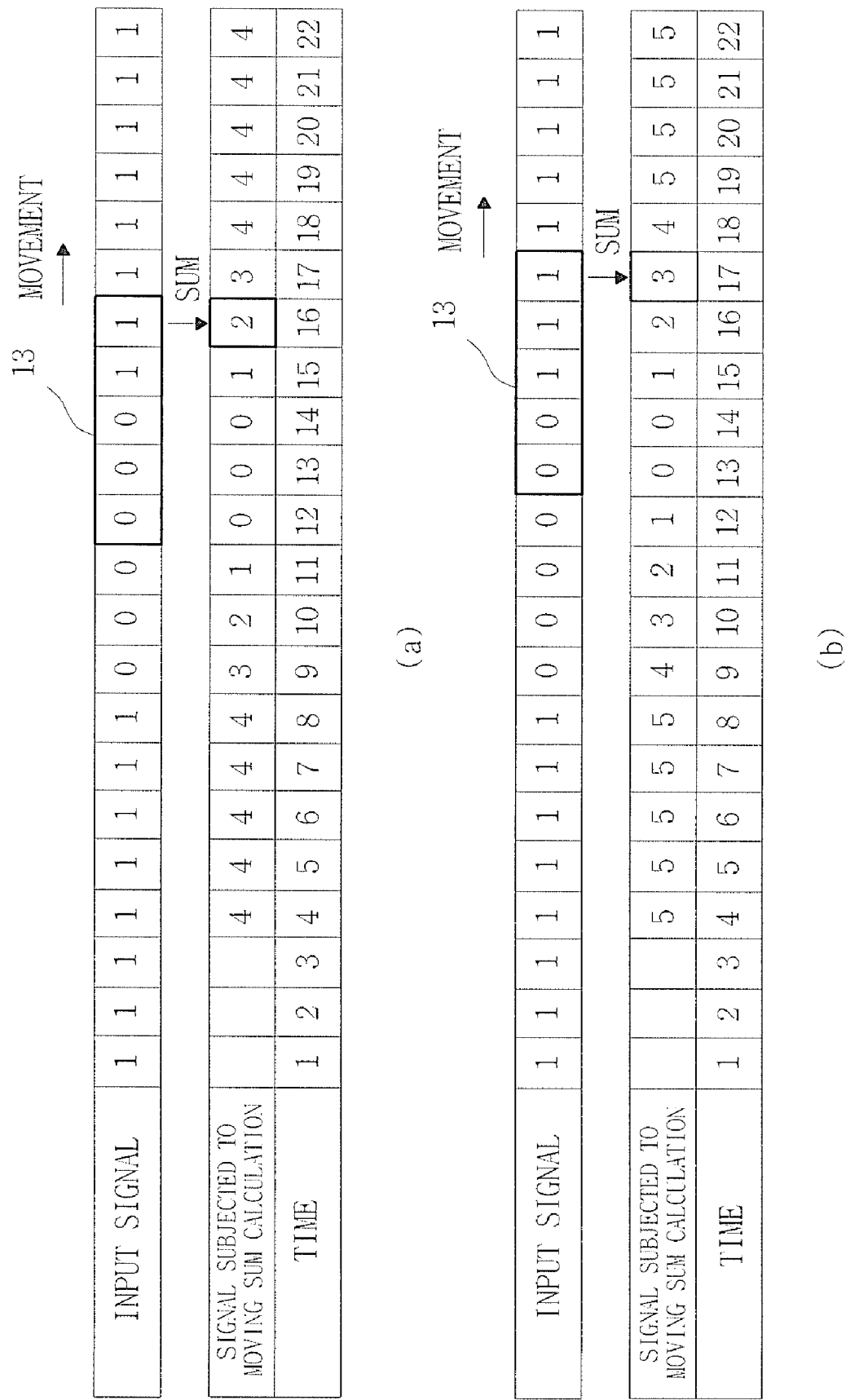

An example of the moving sum calculation is illustrated in FIGS. 2 and 3.

As illustrated in FIG. 2, a square-wave signal having values of the samples, i.e., '... 1 1 1 1 1 1 1 1 0 0 0 0 0 1 1 1 1 1 1 1 ...' is inputted as the input signal CLK_IN. When a moving sum calculation is performed by setting the length of a sliding window 10 as '4' (more specifically, 4 times greater than the period of the sample, which will be briefly referred as '4' hereinbelow), a moving sum signal having values of samples, i.e., '... 4 4 4 4 4 3 2 1 0 0 0 1 2 3 4 4 4 4 4 ...' is outputted.

More specifically, when a time is 16 as illustrated in (a) of FIG. 2, sample values contained in the sliding window 10 are summed up, and the sliding window 10 is then moved by the period of one sample as illustrated in (b) of FIG. 2. Subsequently, sample values contained in the sliding window 10 are summed up in a time of 17.

(a) and (b) of FIG. 3 illustrated values of samples included in a moving sum signal performed by setting the length of a sliding window 13 as '5' when the same signal as the square-wave signal illustrated in FIG. 2 is inputted.

The concept of the moving sum calculation has been illustrated in detail. For further understanding, the sliding window is defined by a section containing some previous samples from the time when a sample obtained by performing a moving sum calculation is outputted. However, it will be readily understood by those skilled in the art that the moving sum calculation is not necessarily limited thereto. That is, as long as the moving sum unit 100 according to the present invention is physically implemented, it is possible to define a section containing some subsequent samples from the time when a sample obtained by performing a moving sum calculation is outputted as a sliding window. Further, it is unnecessary that the time when a sample obtained by performing a moving sum calculation is outputted should be included in the sliding window.

Hereinafter, a method for duty cycle correction using the moving sum calculation according to the present invention will be described in detail.

Figure 4:
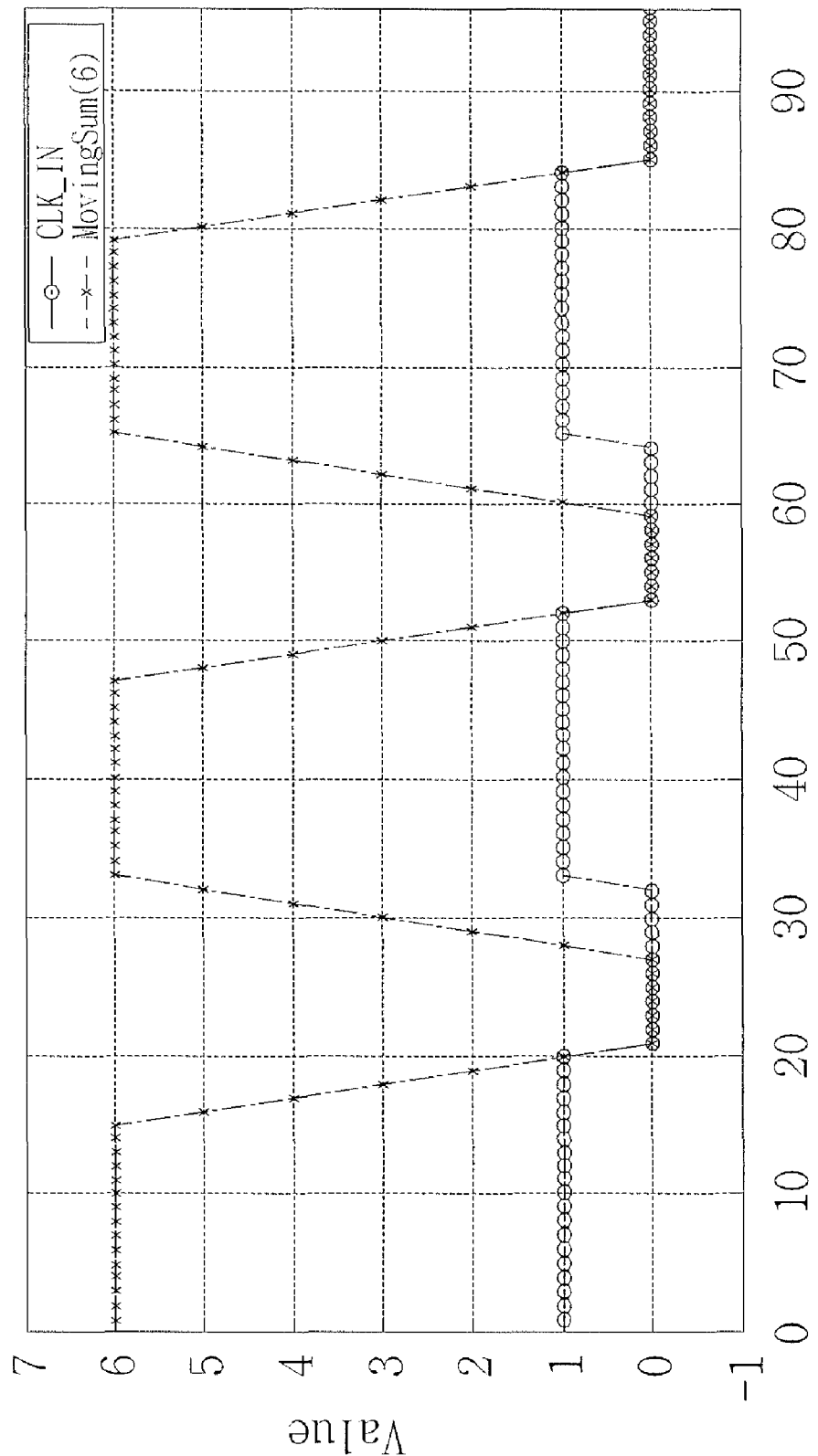
FIG. 4 is a graph illustrating a signal obtained by performing a moving sum calculation with respect to an input signal.

FIG. 4 is a graph illustrating a signal Moving Sum(6) obtained by performing a moving sum calculation with respect to a square-wave signal CLK_IN in the moving sum unit 100 in which the length of the sliding window is set as '6'.

As illustrated in FIG. 4, values of samples included in the square-wave signal CLK_IN are inputted as '1' and then changed immediately into '0' to be inputted. On the other hand, values of samples included in the signal Moving Sum (6) subjected to moving sum calculation are slowly changed from '6' to '0' via values '5, 4, 3, 2, 1'. Accordingly, the rapidly changed square-wave signal CLK_IN can be changed into a slowly changed signal by the moving sum unit 100.

The comparison unit 200 compares the signal subjected to moving sum calculation by the moving sum unit 100 with a threshold voltage Threshold, thereby outputting a high or low signal.

More specifically, the comparison unit 200 compares a voltage corresponding to the moving sum signal with the threshold voltage. When the voltage corresponding to the moving sum signal is higher than the threshold voltage, the comparison unit 200 determines the voltage as '1' and outputs a high signal. When the voltage corresponding to the moving sum signal is lower than the threshold voltage, the comparison unit 200 determines the voltage as '0' and outputs a Low signal.

Figure 5:
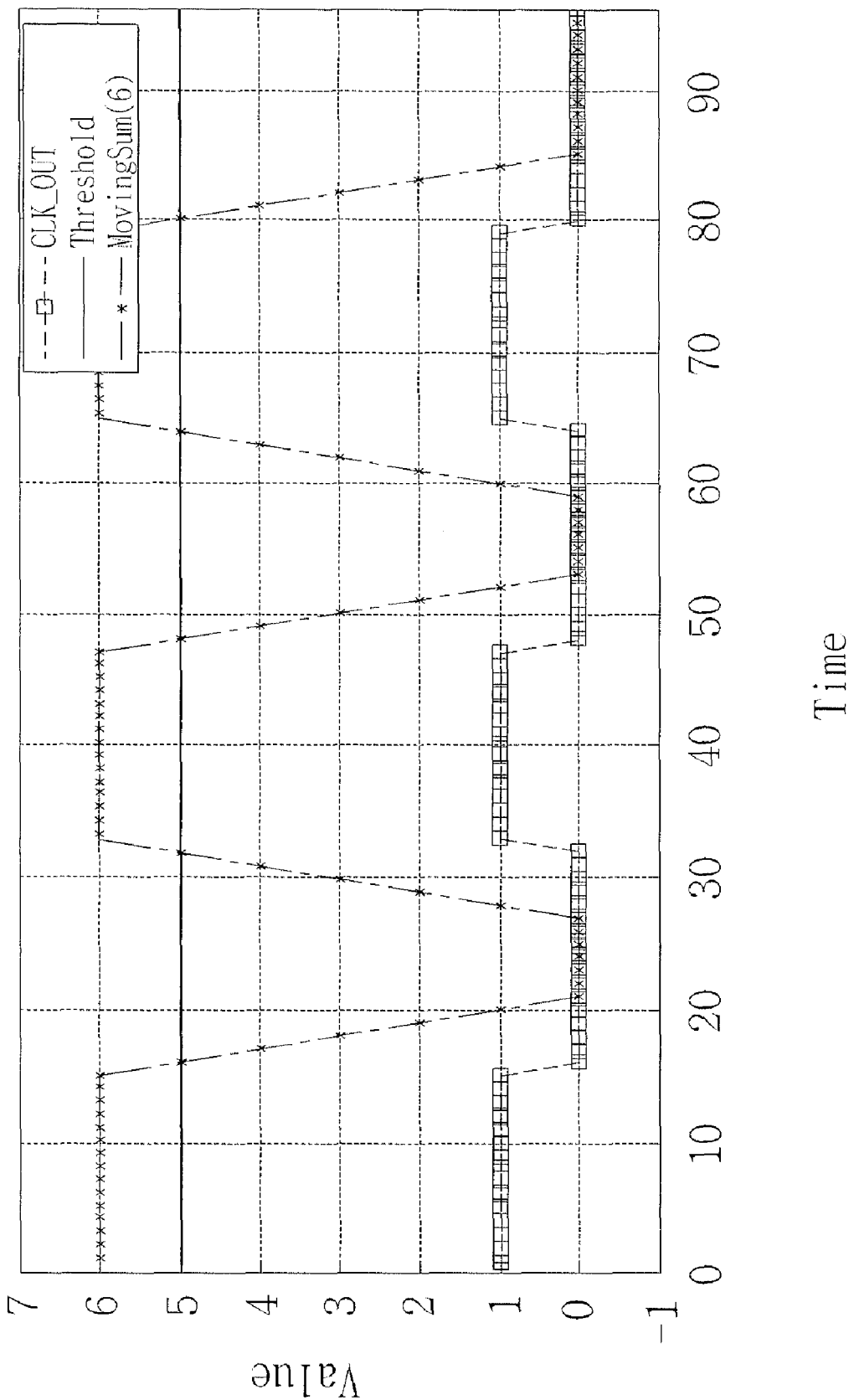
FIG. 5 is a graph Illustrating a signal obtained by applying a threshold voltage to the signal illustrated in FIG. 4 and correcting the duty cycle of the signal.

FIG. 5 is a graph illustrating an output signal performed by the comparison unit 200 using the moving sum signal Moving Sum(6) and a threshold voltage Threshold set as '5'. When comparing the input signal CLK_IN of FIG. 4 with the output signal CLK_OUT of FIG. 5, it can be seen that the duty cycle of the input signal CLK_IN of FIG. 4 is changed.

Figure 6:
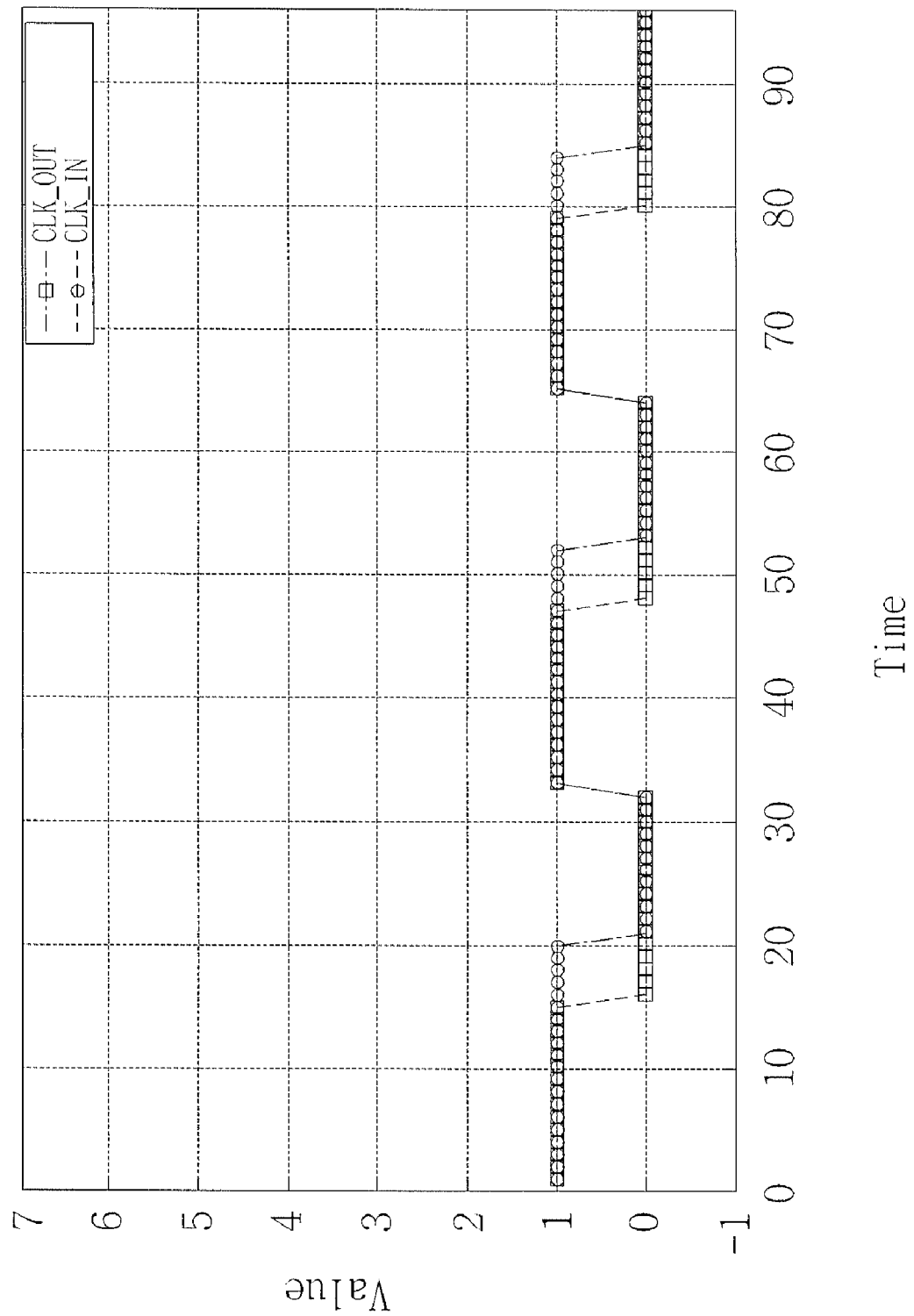
FIG. 6 is a graph simultaneously illustrating the input signal and the signal having the corrected duty cycle.

FIG. 6 is a graph simultaneously illustrating a square-wave signal CLK_IN in which the ratio of high section:low section is a ratio of 6.25:3.75 and an output signal CLK_OUT obtained by correcting the square-wave signal CLK_IN in which the ratio of high section:low section is a ratio of 5.3:4.7.

When the apparatus for duty cycle correction is initially driven, the threshold voltage in the comparison unit 200 is reset by the threshold voltage control unit 400, and therefore, the threshold voltage may be initially set as any value. The setting of the threshold voltage will be described in detail through the threshold voltage control unit 400 which will be described later.

The mean value calculation unit 300 calculates the mean value of an output signal CLK_OUT included in a section integer times greater than the period of the output signal CLK_OUT outputted by the comparison unit 200 (the period of the output signal CLK_OUT outputted by the comparison unit 200 is identical to that of the square-wave signal CLK_IN inputted to the moving sum unit 100). The mean value calculation unit 300 calculates a mean value using a method of dividing the sum of sample values constituting the output signal CLK_OUT included in a section integer times greater than the period of the output signal CLK_OUT by the number of samples. The mean value calculation unit 300 repeatedly calculates a mean value by the predetermined period.

Figure 7:
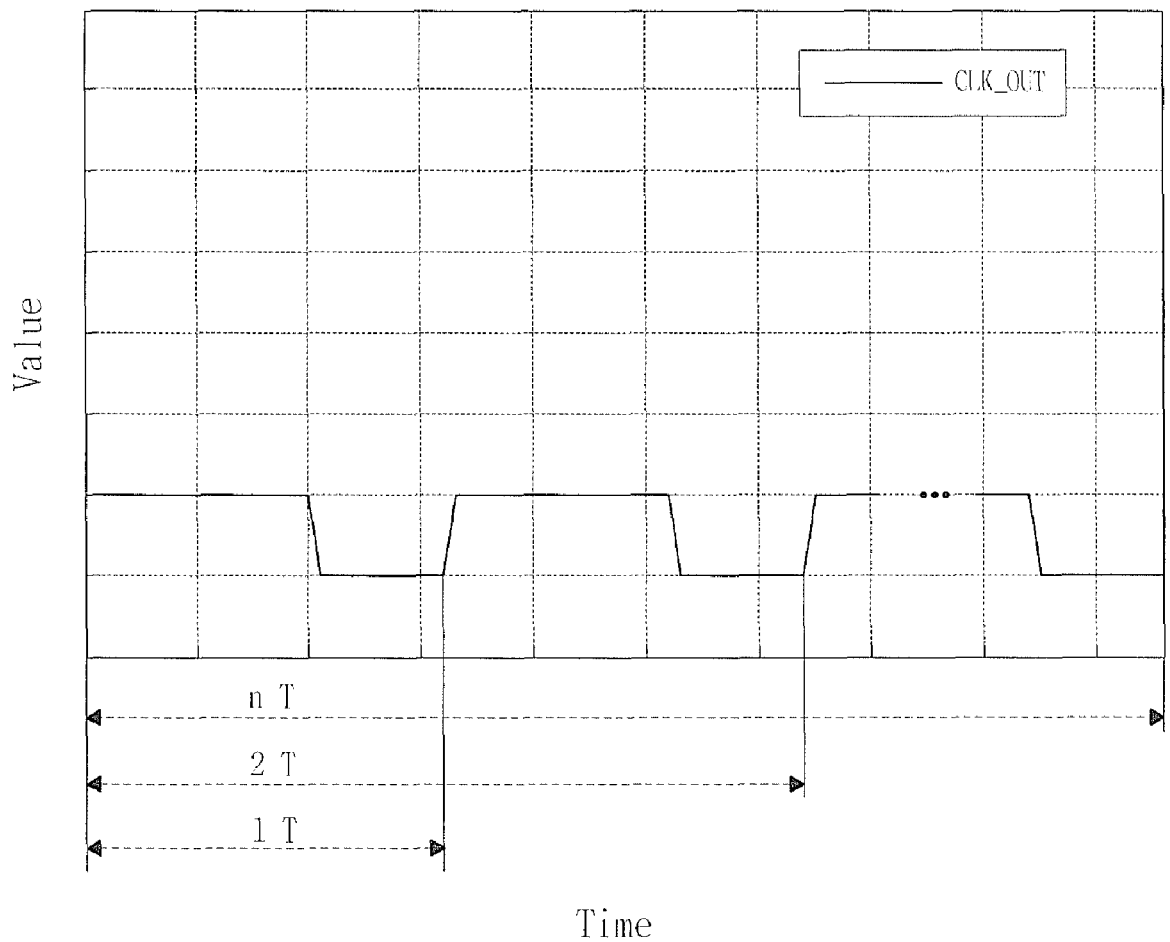
FIG. 7 is a graph illustrating a period setting method for calculating a mean value.

As illustrated in FIG. 7, the period at which the mean value calculation unit 300 calculates the mean value of an output signal CLK_OUT may be set as at least one period 1T of the output signal CLK_OUT or as a period nT integer times than that of the output signal CLK_OUT. As the set period is long, the accuracy of the mean value is increased, but the control time of the threshold voltage is lengthened. Accordingly, it is important to set a suitable period.

The threshold voltage control unit 400 controls the threshold voltage set in the comparison unit 200 by comparing the mean value obtained from the mean value calculation unit 300 with a middle value. More specifically, the threshold voltage control unit 400 compares the size of the mean value with that of the middle value. The middle value has a middle voltage level between high and low signals outputted from the comparison unit 200. For example, when the high signal has a value of '1' and the low signal has a value of '0', the middle voltage level has a value of '0.5'.

If the duty cycle of the output signal CLK_OUT outputted from the comparison unit 200 reaches 50%, the mean value is identical to the middle value. When the mean value is higher than the middle value, the duty cycle of the high signal for the output signal CLK_OUT is over 50%, and therefore, the threshold voltage control unit 400 increases the threshold voltage set in the comparison unit 200. Accordingly, as a threshold voltage is set higher than that in the previous step in the comparison unit 200, the duty cycle of the high signal can be decreased. When the mean value is lower than the middle value, the duty cycle of the low signal for the output signal CLK_OUT is over 50%, and therefore, the threshold voltage set in the comparison unit 200 is decreased. Accordingly, as a threshold voltage is set lower than that in the previous step in the comparison unit 200, the duty cycle of the low signal can be decreased.

Figure 8:
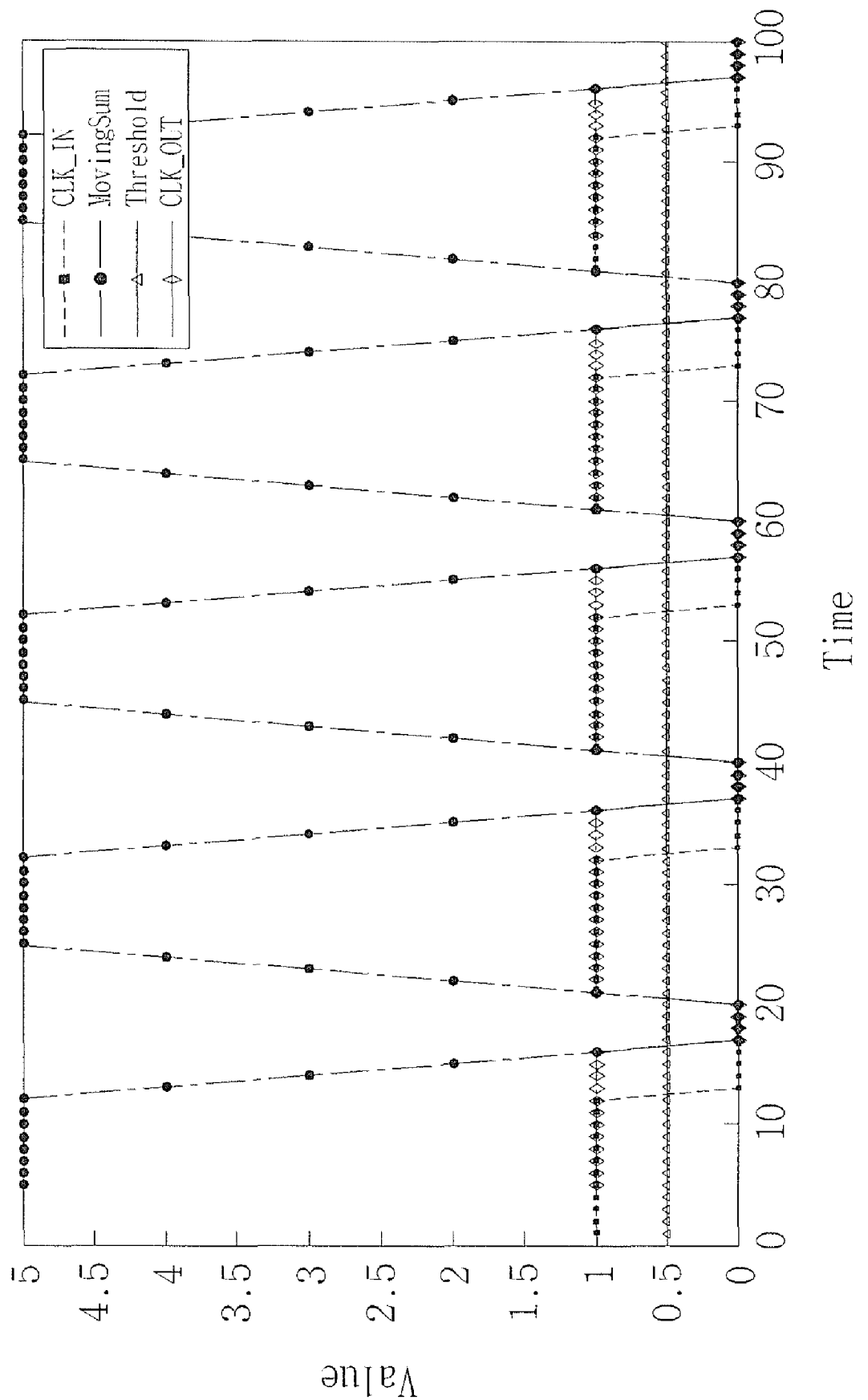
FIGS. 8 and 9 are graphs illustrating examples of a duty cycle corrected by controlling a threshold voltage.
Figure 9:
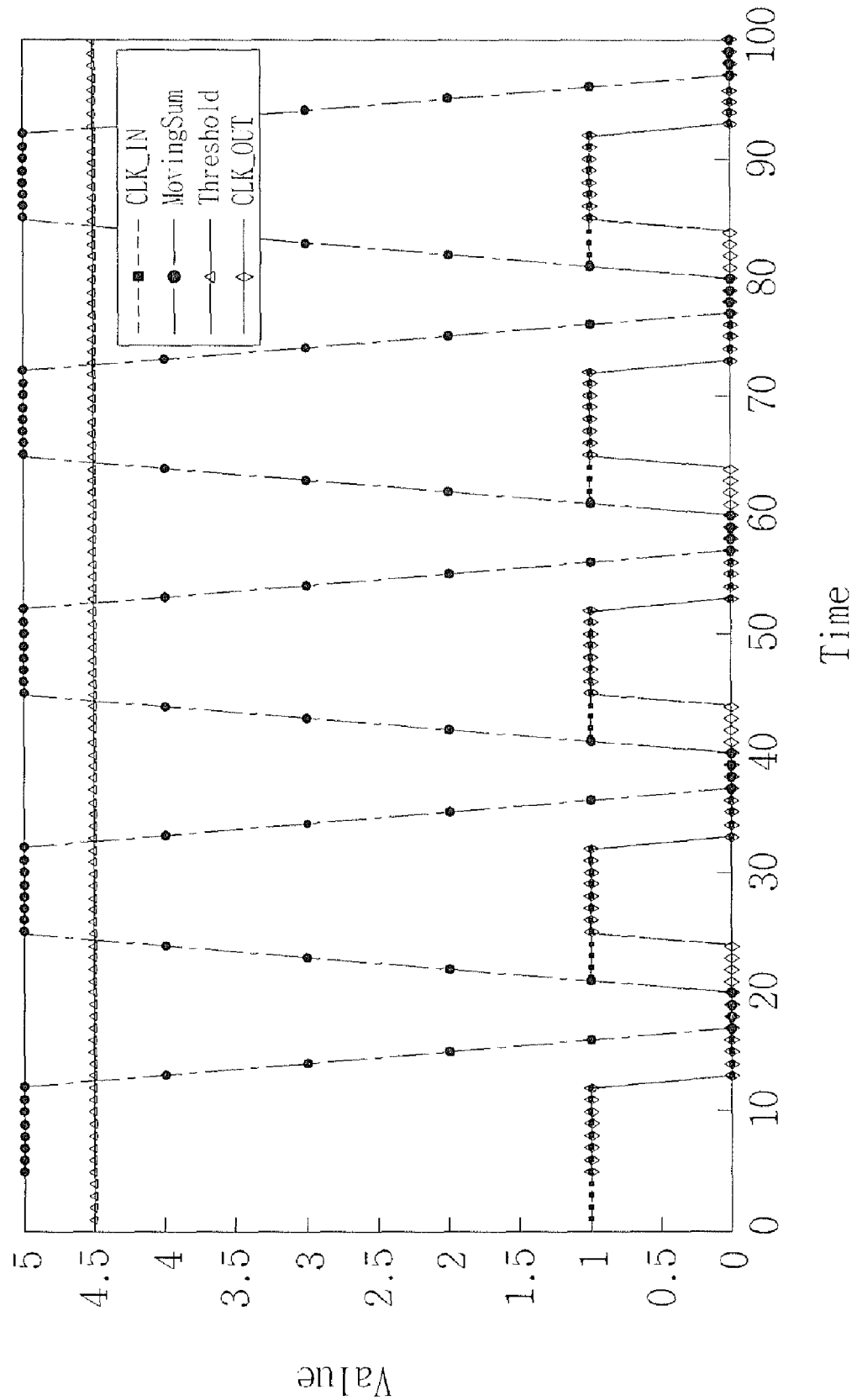

As illustrated in FIG. 8, when the mean value of the output signal CLK_OUT is higher than the middle value, the threshold voltage Threshold set as 0.5 is necessarily increased to allow the duty cycle of the output signal CLK_OUT to be 50%. Accordingly, as illustrated in FIG. 9, it can be seen that the duty cycle of the output signal CLK_OUT is changed by increasing the threshold voltage Threshold up to 4.5. In FIG. 9, since the mean value of the output signal CLK_OUT is lower than the middle value, the threshold voltage Threshold is necessarily decreased. Therefore, it is important that the threshold voltage is controlled to performing exact duty cycle correction.

In the threshold voltage control unit 400 implemented in a digital manner, an n-bit threshold voltage may be divided into 2n voltage levels, and a basic unit for increasing the threshold voltage may be represented by the following equation.

$$\text{Min}(\Delta_{Threshold}) = \frac{\text{depth} \times (\text{VDD\_HIGH} - \text{VDD\_LOW})}{2^n} \quad (1)$$

In Equation 1, "$\text{Min}(\Delta_{Threshold})$" denotes a minimum variation of the threshold voltage, and "depth" denotes the number of samples defined by a sliding window so as to perform a moving sum calculation with respect to a square-wave signal CLK_IN. "VDD_HIGH" denotes a voltage corresponding to a high signal from output signals of the comparison unit 200. "VDD_LOW" denotes a voltage corresponding to a low signal from output signals of the comparison unit 200. Accordingly, the n-bit threshold voltage can be increased/decreased by at least "$\text{Min}(\Delta_{Threshold})$" at the set level. In the threshold voltage control unit 400 implemented in an analog manner, the increment/decrement of the threshold voltage can be arbitrarily set.

Figure 10:
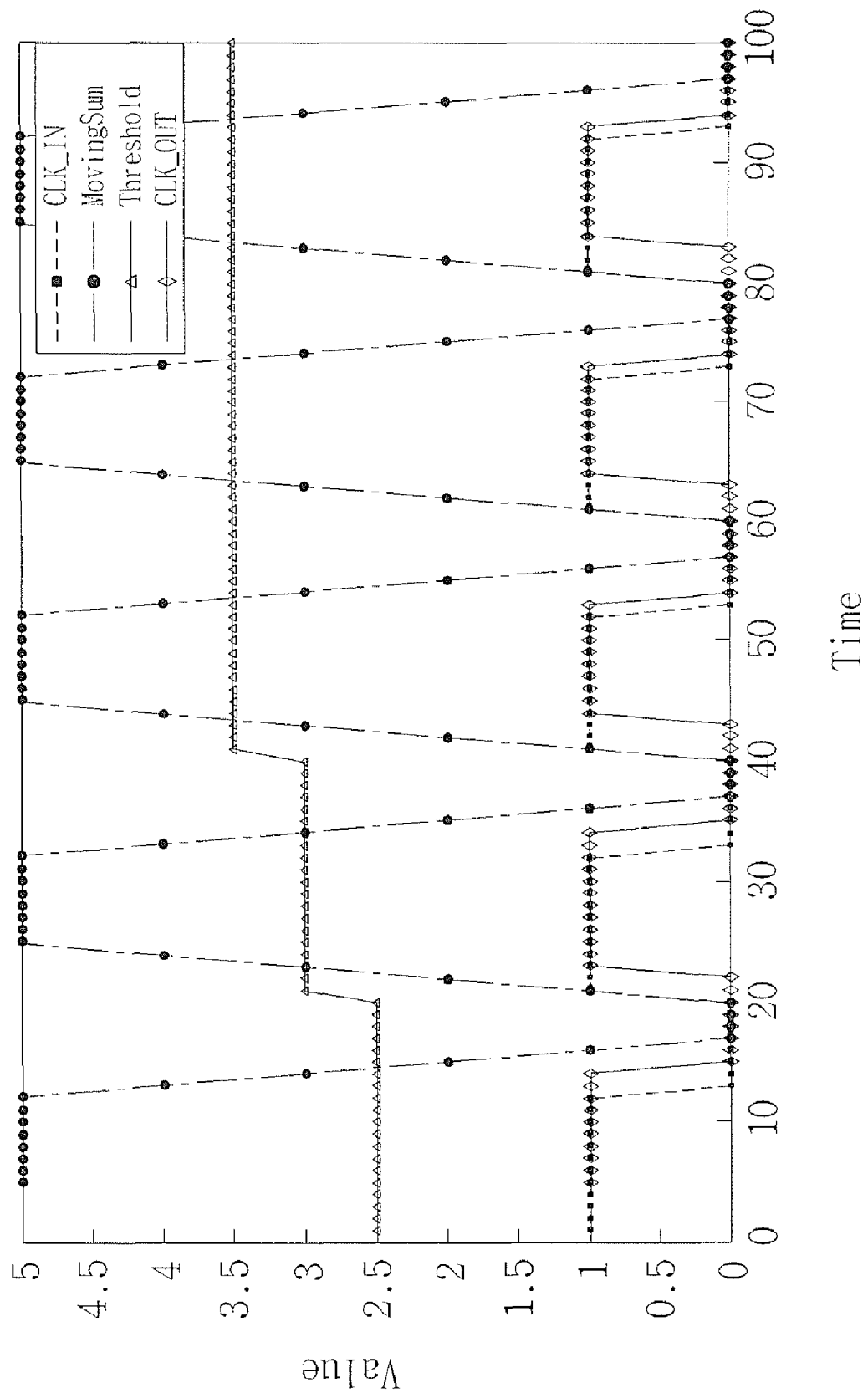
FIG. 10 is a graph illustrating a process of setting a duty cycle to be 50% by controlling a threshold voltage.

FIG. 10 is a graph illustrating a process of setting the duty cycle of an output signal as 50%. In the process, a sliding window is set as '5', and a signal subjected to moving sum calculation is compared with a threshold voltage initially set as '2.5'. As a result, an output signal is outputted, and an operation of allowing the threshold voltage to be increased by '0.5' depending on the mean value of the output signal is performed twice, thereby setting the duty cycle of the output signal as 50%. FIG. 10 illustrates a duty cycle correction process for an input signal having one period.

Figure 11:
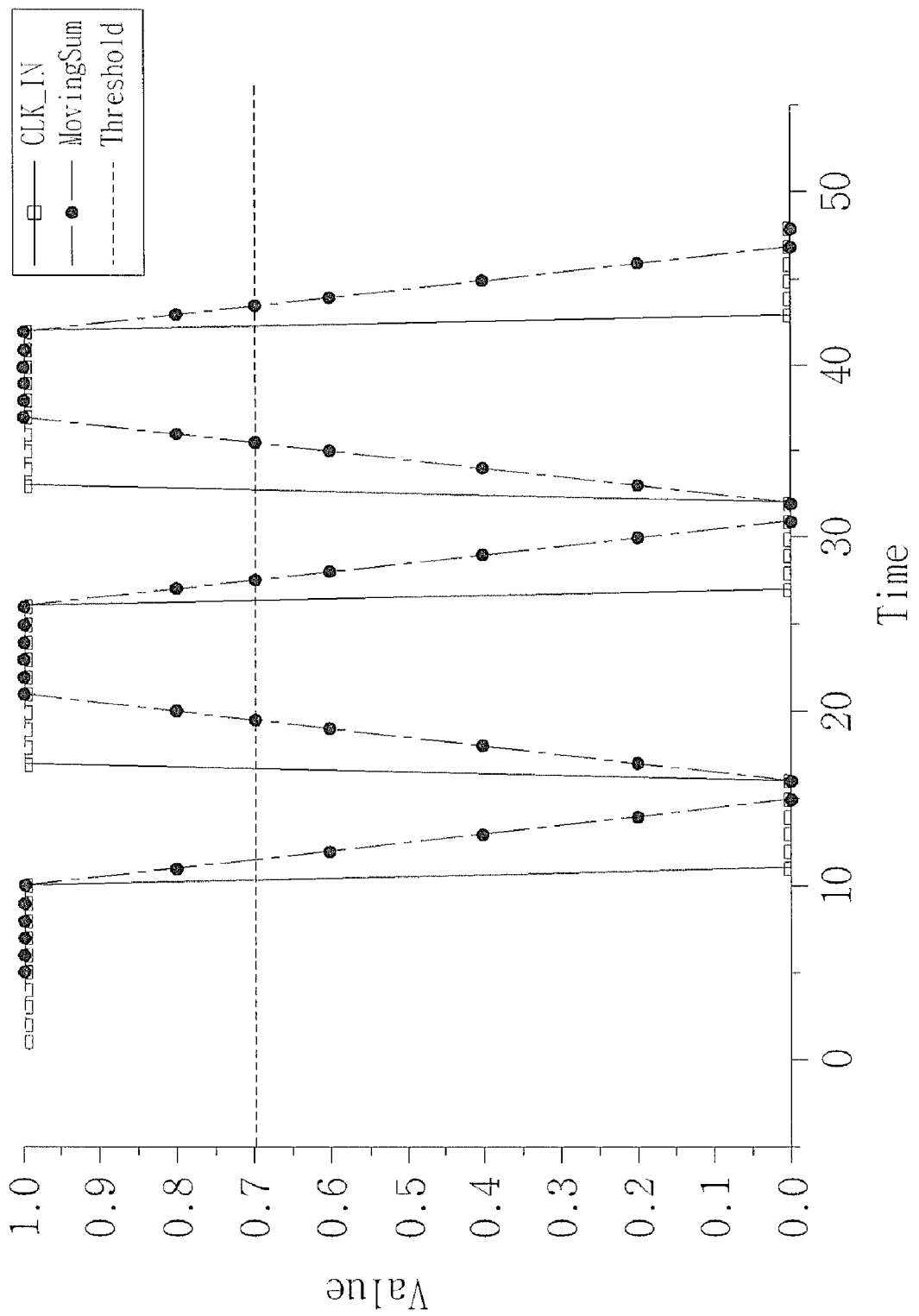
FIGS. 11 and 12 are graphs illustrating examples of methods for duty cycle corrections.

FIG. 11 is a graph simultaneously illustrating an input signal CLK_IN and a signal Moving Sum. In the input signal CLK_IN, the ratio of high section:low section is a ratio of 6:4. The signal Moving Sum is obtained by setting a sliding window as '5', performing a moving sum calculation with respect to the input signal CLK_IN and then allowing the input signal CLK_IN subjected to moving sum calculation to be scaled down to ⅕. In FIG. 11, the threshold voltage is set as 3.5 but scaled down to ⅕, i.e., 0.7.

Figure 12:
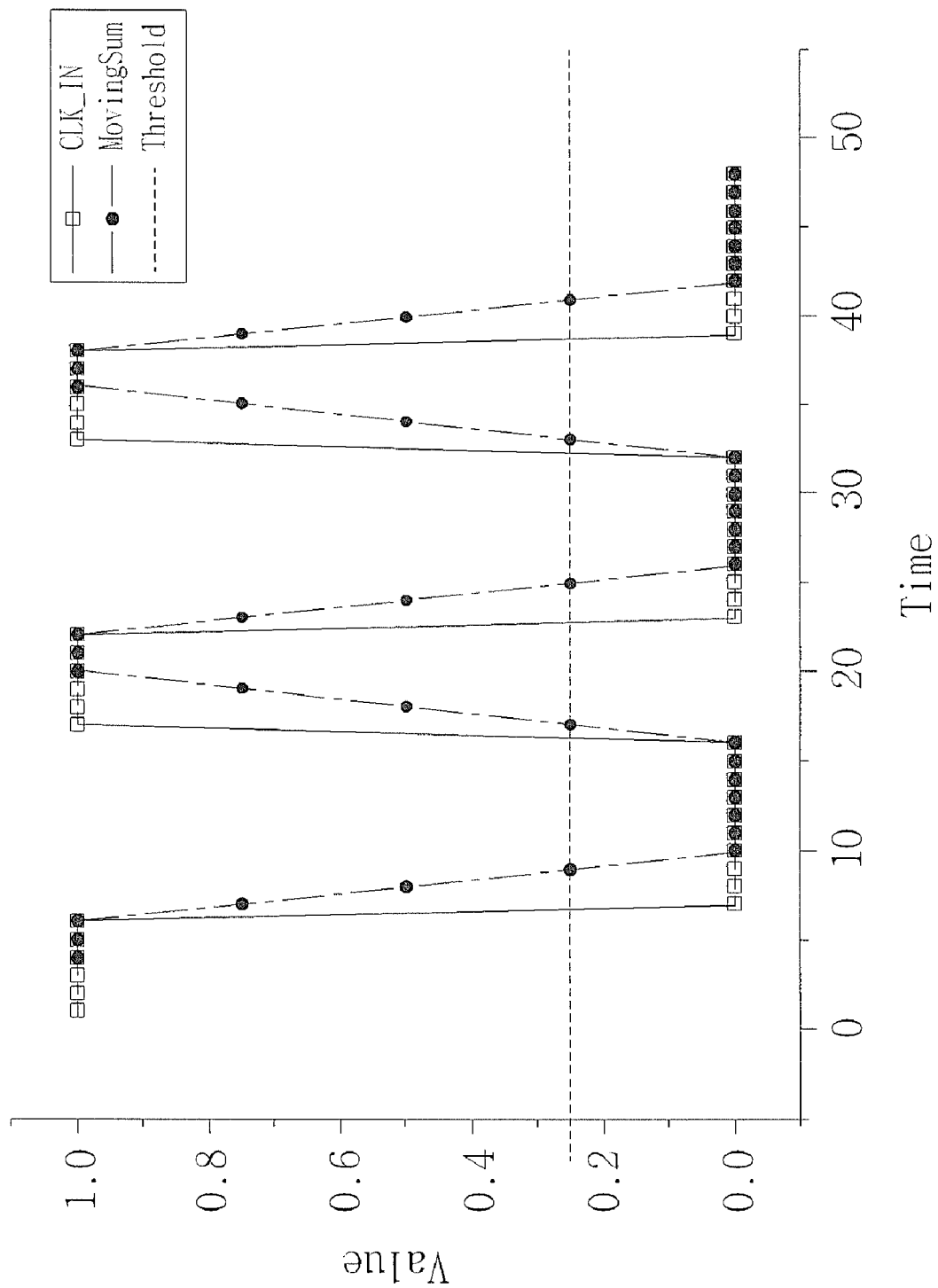

FIG. 12 is a graph simultaneously illustrating an input signal CLK_IN and a signal Moving Sum. In the input signal CLK_IN, the ratio of high section:low section is a ratio of 4:6. The signal Moving Sum is obtained by setting a sliding window as '4', performing a moving sum calculation with respect to the input signal CLK_IN and then allowing the input signal CLK_IN subjected to moving sum calculation to be scaled down to ¼.

In FIG. 12, the threshold voltage is set as 1 but scaled down to ¼, i.e., 0.25. Accordingly, although the duty cycle of the square-wave signal CLK_IN is not 50%, the duty cycle of the output signal CLK_OUT can be corrected as 50% by controlling the threshold voltage Threshold. At this time, the threshold voltage Threshold has a different value depending on the duty cycle of the square-wave signal CLK_IN and the number Depth of data samples of the square-wave signal CLK_IN subjected to moving sum calculation. For example, when the threshold voltage Threshold is 3.5 in FIG. 11, the duty cycle of the output signal CLK_OUT is 50%. When the threshold voltage Threshold is 1 in FIG. 12, the duty cycle of the output signal CLK_OUT is 50%.

Hereinafter, a method for duty cycle correction according to an embodiment of the present invention will be described in detail with reference to the accompanying drawings.

Figure 13:
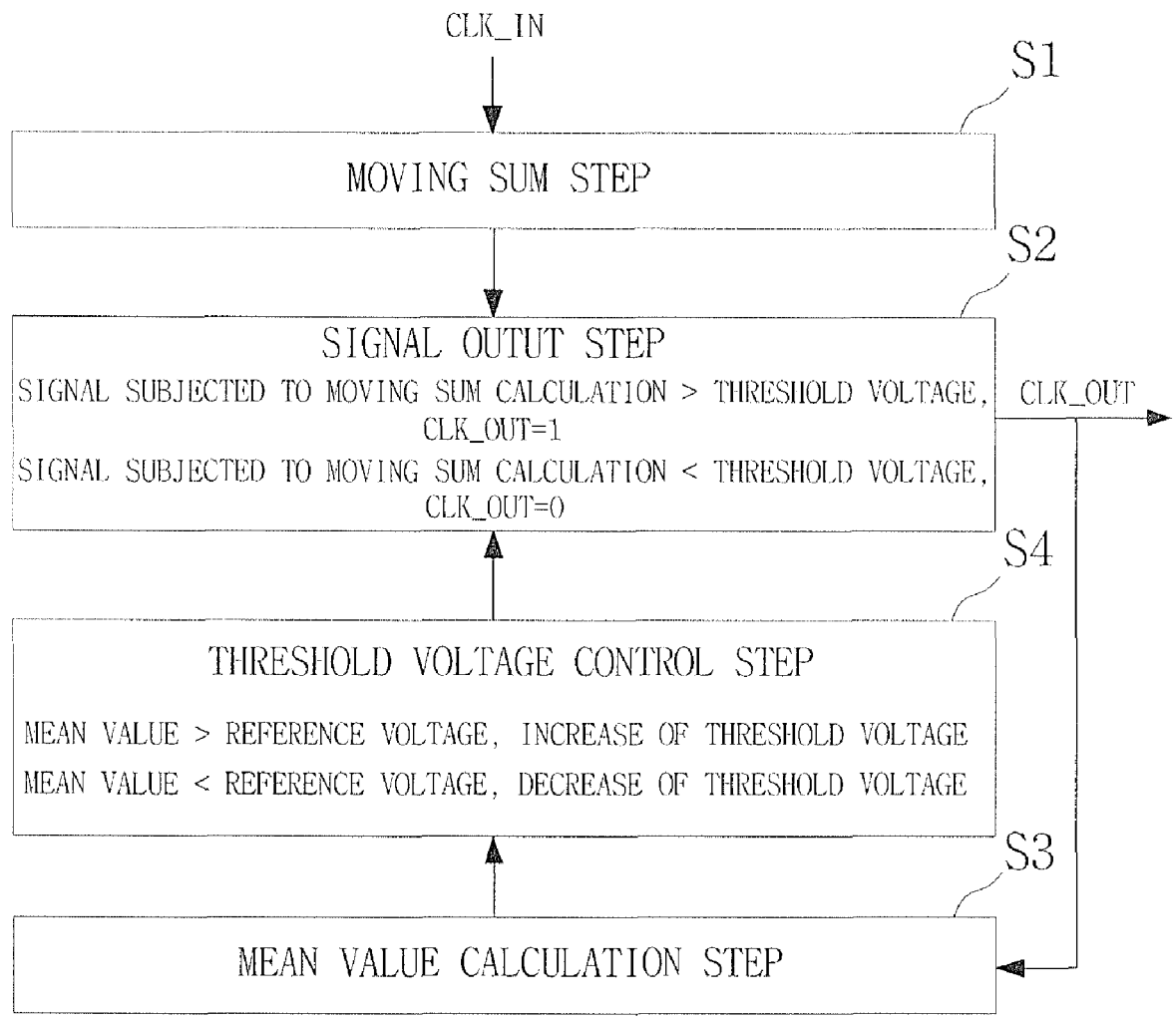
FIG. 13 is a flowchart schematically illustrating a method for duty cycle correction according to an embodiment of the present invention.

FIG. 13 is a flowchart schematically illustrating a method for duty cycle correction according to an embodiment of the present invention.

Referring to FIG. 13, the method for duty cycle correction according to the embodiment of the present invention comprises a moving sum step (S1), a signal output step (S2), a mean value calculation step (S3) and a threshold voltage control step (S4).

In the moving sum step (S1), a square-wave signal CLK_IN having a distorted duty cycle and a uniform period is inputted, and a moving sum signal is outputted by performing a moving sum calculation with respect to the inputted square-wave signal CLK_IN using a sampling frequency.

In the signal output step (S2), a high or low signal is outputted by comparing the signal subjected to moving sum calculation in the moving sum step (S1) with a threshold voltage Threshold. More specifically, a voltage corresponding to the signal subjected to moving sum calculation is compared with the threshold voltage in the signal output step (S2). When the voltage corresponding to the signal subjected to moving sum calculation is higher than the threshold voltage, the voltage is determined as '1' and a high signal is outputted. When the voltage corresponding to the signal subjected to moving sum calculation is lower than the threshold voltage, the voltage is determined as '0' and a low signal is outputted.

In the mean value calculation step (S3), the mean value of the output signal CLK_OUT is calculated. The output signal CLK_OUT is included in a section integer times than the period of the output signal CLK_OUT outputted in the signal output step (S2). More specifically, in the mean value calculation step (S3), a mean value is calculated using a method of dividing the sum of sample values constituting the output signal CLK_OUT included in a section integer times greater than the period of the output signal CLK_OUT by the number of samples. In the mean value calculation step (S3), a mean value is repeatedly calculated by the predetermined period.

The period of the output signal CLK_OUT outputted in the mean value calculation step (S3) is identical to that of the square-wave signal CLK_IN inputted in the moving sum step (S1). As illustrated in FIG. 7, the period at which the mean value of the output signal CLK_OUT is calculated may be set as at least one period 1T or as a period nT integer times than that of the output signal CLK_OUT. As the set period is long, the accuracy of the mean value is increased, but the control time of the threshold voltage is lengthened. Accordingly, it is important to set a suitable period.

In the threshold voltage control step (S4), the threshold voltage set in the signal output step (S2) is controlled by comparing the mean value obtained in the mean value calculation step (S3) with a middle value.

While the present invention has been particularly shown and described with reference exemplary embodiments thereof, it will be understood by those of ordinary skill in the art that various changes in form and details may be made therein without departing from the spirit and scope of the present invention as defined by the following claims.

Therefore, the scope of the present invention should be understood within the scope of the present invention defined by the appended claims.

What is claimed is:

1. An apparatus for duty cycle correction which corrects the duty cycle of a square-wave signal having a distorted duty cycle, wherein the square-wave signal is a signal having samples with a period that is shorter than that of the square-wave signal, the apparatus comprising:

a moving sum unit performing a moving sum calculation with respect to the square-wave signal and outputting a moving sum signal based on the moving sum calculation;

a comparison unit comparing the moving sum signal with a predetermined threshold voltage, outputting a high signal when the moving sum signal is higher than the predetermined threshold voltage, and outputting a low signal when the moving sum signal is lower than the predetermined threshold voltage;

a mean value calculation unit calculating a mean value of an output signal outputted from the comparison unit, the output signal being included in a section having a period that is n times greater than that of the square-wave signal, wherein n is an integer; and a threshold voltage control unit comparing the mean value calculated by the mean value calculation unit with a middle value between the high and low signals, increasing the predetermined threshold voltage when the mean value is greater than the middle value, and decreasing the predetermined threshold voltage when the mean value is less than the middle value.

2. The apparatus according to claim 1, wherein:

the moving sum unit calculates a sum of the samples contained in a sliding window and outputting the calculated sum as the moving sum signal;

the sliding window is slid by the period of one of the samples;

whenever the sliding window is slid by the period of one of the samples, the moving sum unit calculates the sum of the samples contained in the sliding window and outputting the calculated sum as the moving sum signal; and the sliding window is a time section that is x times greater than the period of one of the samples when x is an integer.

* * * * *